(12) United States Patent
Umezaki

(10) Patent No.: US 6,483,191 B2
(45) Date of Patent: Nov. 19, 2002

(54) SEMICONDUCTOR DEVICE HAVING REINFORCED COUPLING BETWEEN SOLDER BALLS AND SUBSTRATE

(75) Inventor: Nobuyuki Umezaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/865,000

(22) Filed: May 24, 2001

(65) Prior Publication Data

US 2001/0048160 A1 Dec. 6, 2001

(30) Foreign Application Priority Data

May 30, 2000 (JP) ........................................ 2000-159940

(51) Int. Cl.$^7$ .............................................. H01L 23/48
(52) U.S. Cl. ...................... 257/738; 257/693; 257/736; 257/737; 257/780; 257/783; 438/613
(58) Field of Search ................................ 257/738, 737, 257/736, 783, 693, 780; 438/613

(56) References Cited

U.S. PATENT DOCUMENTS

| | | | |
|---|---|---|---|
| 5,583,747 A | * 12/1996 | Baird et al. | 228/180.21 |
| 5,847,456 A | * 12/1998 | Shoji | 257/693 |
| 5,953,592 A | * 9/1999 | Taniguchi et al. | 438/118 |
| 6,372,549 B2 | * 4/2002 | Urushima | 257/678 |
| 6,380,621 B1 | * 4/2002 | Ando et al. | 257/707 |

FOREIGN PATENT DOCUMENTS

| | | |
|---|---|---|
| JP | 10098045 | 4/1998 |
| JP | 10173006 | 6/1998 |
| JP | 11251471 | 9/1999 |
| JP | 2000012730 | 1/2000 |

* cited by examiner

Primary Examiner—Richard Elms
Assistant Examiner—Douglas Menz
(74) Attorney, Agent, or Firm—Katten, Muchin, Zavis, Rosenman

(57) ABSTRACT

A semiconductor device including a semiconductor element mounted on a first surface of a wiring substrate, and a plurality of conductive land portions formed and exposed at a second surface of the wiring substrate which is opposite to the first surface. A plurality of solder balls are respectively joined to the plurality of conductive land portions. A plurality of reinforcement resin film portions are formed to reinforce coupling between the solder balls and the conductive land portions. Each of the reinforcement resin film portions is formed around a portion of the solder ball joining to the conductive land portion. Each of the reinforcement resin film portions being bent to form a portion along the wiring substrate and a portion along the side surface of the solder ball. The coupling between the solder balls and the conductive land portions is reinforced by elastic force of the bent portions of the reinforcement resin film portions.

7 Claims, 4 Drawing Sheets

SEMICONDUCTOR DEVICE HAVING REINFORCED COUPLING BETWEEN SOLDER BALLS AND SUBSTRATE

FIELD OF THE INVENTION

The present invention relates generally to a semiconductor device and a method of manufacturing the same, and more particularly to improving reliability of connection between solder balls and a wiring substrate in a Ball Grid Array (BGA) type semiconductor device.

BACKGROUND OF THE INVENTION

Recently, a technology is required for mounting and coupling a semiconductor package having a large number of connecting terminals onto a wiring substrate which becomes a mother board. To cope with such requirement, a Ball Grid Array (BGA) type package is practically used in which a large number of solder balls are disposed in a grid like arrangement on connecting terminals. A basic structure of the BGA type package is as follows. That is, in the BGA type package, a semiconductor chip is mounted on the face surface of a double-sided wiring substrate and solder balls are formed on the backside surface of the double-sided wiring substrate. On the face surface of the double-sided wiring substrate, there are formed electrode patterns which are electrically coupled with electrodes of the semiconductor chip. On the backside surface of the double-sided wiring substrate, there are formed conductive land portions which are electrically coupled with the electrode patterns on the face side and to which the solder balls are joined.

Japanese patent laid-open publication No. 10-98045 discloses an example of such BGA type package. In the structure disclosed in Japanese patent laid-open publication No. 10-98045, solder balls are joined onto land portions which are formed on a substrate and which are exposed via a solder resist layer. Thereafter, resin material for reinforcement is applied around a root portion of each of the solder balls.

However, the structure of Japanese patent laid-open publication No. 10-98045 has the following problems. That is, when the resin material for reinforcement is applied, it is necessary to selectively form a mask resin layer on the top portion of each solder ball, in order to prevent the resin material for reinforcement from attaching to the top portion of each solder ball. Here, the mask resin layer is made of a material which does not have affinity with the resin material for reinforcement. Further, it is also required that, after forming the resin material for reinforcement, the mask resin layer is removed. Therefore, a manufacturing process becomes complicated, and manufacturing costs are increased.

SUMMARY OF THE INVENTION

Therefore, it is an object of the present invention to obviate the disadvantages of the conventional semiconductor device and of the conventional method of manufacturing the semiconductor device.

It is another object of the present invention to provide a semiconductor device and a method of manufacturing the semiconductor device in which reliability of connection between solder balls and a wiring substrate can be improved.

It is still another object of the present invention to provide a semiconductor device and a method of manufacturing the semiconductor device in which reliability of connection between solder balls and a wiring substrate can be improved without increasing the number of manufacturing process steps and manufacturing costs.

It is still another object of the present invention to provide a semiconductor device and a method of manufacturing the semiconductor device in which resin portions for reinforcing the connection between the solder balls and the wiring substrate can be formed easily.

It is still another object of the present invention to provide a semiconductor device and a method of manufacturing the semiconductor device in which resin portions for reinforcing the connection between the solder balls and the wiring substrate can be formed, without increasing the number of manufacturing process steps and manufacturing costs.

It is still another object of the present invention to provide a semiconductor device and a method of manufacturing the semiconductor device in which resin portions for reinforcing the connection between the solder balls and the wiring substrate can be formed, without forming a mask resin layer on the top portion of each solder ball.

In the present invention, a reinforcement resin film is formed in the peripheral portion of each of conductive land portions on a substrate for coupling solder balls thereto, before the process of coupling the solder balls to the substrate of a semiconductor device. In the process of coupling the solder balls to the substrate of the semiconductor device, a portion of the reinforcement resin film is pushed away from each of the conductive land portions by the material of the solder ball which is melted by heating. In the present invention, the reinforcement resin film is formed by utilizing this phenomenon. As a result, both a process of previously forming a mask layer on the solder balls and a process of removing the mask layer become unnecessary.

The reinforcement resin film formed in this way surrounds each of the root portions of the solder balls, and is bent at an inner area thereof. The bent portion of the reinforcement resin film pushes the root portion of each of the solder balls by restitutive force or elastic force. Thereby, coupling between the solder balls and the conductive land portions can be reinforced. Even if a stress such as a shearing stress is applied to an interface portion between each of the solder balls and the substrate, it is possible to absorb or disperse such stress into the material of the reinforcement resin film. Also, in the semiconductor device fabricated in this way, a quantity of material for the reinforcement resin film can be minimum, and does not affect the costs of the semiconductor device. Further, when the semiconductor device is mounted on a mother board and the like, the reinforcement resin film does not become a hindrance to the mounting of the semiconductor device.

According to an aspect of the present invention, there is provided a semiconductor device comprising: a wiring substrate; a semiconductor element mounted on a first surface of the wiring substrate; a plurality of conductive land portions exposed respectively via openings of an insulating material portion of a second surface of the wiring substrate which is opposite to the first surface; a plurality of solder balls respectively joined to the plurality of conductive land portions; and a plurality of reinforcement resin film portions for reinforcing coupling between the solder balls and the conductive land portions, each of the reinforcement resin film portions being formed around a portion of the solder ball joining to the conductive land portion, and each of the reinforcement resin film portions being bent to form a portion along the wiring substrate and a portion along the side surface of the solder ball.

In this case, it is preferable that coupling between the solder balls and the conductive land portions is reinforced by elastic force of the bent portions of the reinforcement resin film portions.

It is also preferable that the plurality of conductive land portions are electrically coupled with electrodes of the semiconductor element.

It is further preferable that each of the reinforcement resin film portions has a structure in which an inner circumferential portion of a ring shaped film having a uniform thickness is pushed and bent away from the conductive land portion.

It is advantageous that the surface of the conductive land portion is recessed from a surface portion of the second surface of the wiring substrate at the peripheral portion of the conductive land portion.

It is also advantageous that the reinforcement resin film portions are made of silicone resin.

It is further advantageous that the wiring substrate is a flexible wiring substrate in which a conductive wiring pattern layer is sandwiched by insulating layers.

According to another aspect of the present invention, there is provided a method of manufacturing a semiconductor device comprising: preparing a semiconductor element; preparing a wiring substrate, the wiring substrate having a first surface on which the semiconductor element is to be mounted and a second surface opposite to the first surface, wherein a plurality of conductive land portions being exposed respectively via openings of an insulating material portion of the second surface of the wiring substrate; mounting the semiconductor element on the first surface of the wiring substrate; forming a plurality of reinforcement resin film portions on the second surface of the wiring substrate, each of the reinforcement resin film portions having an opening portion, each of the reinforcement resin film portions partially overlapping a corresponding one of the conductive land portions, and a portion of each of the conductive land portions being exposed via the opening portion of the corresponding one of the reinforcement resin film portions; disposing solder balls respectively on the conductive land portions which expose via the opening portions of the reinforcement resin film portions, and heating and melting the solder balls, the portions of the reinforcement resin film portions which overlap the conductive land portions being pushed away from the conductive land portions; and cooling and curing the melted solder balls.

In this case, it is preferable that, after the cooling and curing the melted solder balls, coupling between the solder balls and the conductive land portions is reinforced by the reinforcement resin film portions.

It is also preferable that each of the conductive land portions has a circle shape, each of the opening portions of the reinforcement resin film portions has a circle shape, the center of each of the conductive land portions substantially conforms to the center of the corresponding one of the reinforcement resin film portions, and the diameter of each of the conductive land portions is larger than the diameter of the corresponding one of the opening portions of the reinforcement resin film portions.

It is further preferable that the forming a plurality of reinforcement resin film portions on the second surface of the wiring substrate is performed by using a screen printing method, before the disposing solder balls respectively on the conductive land portions which expose via the opening portions of the reinforcement resin film portions and heating and melting the solder balls.

It is advantageous that the reinforcement resin film portions are made of silicone resin.

It is also advantageous that a gap is formed between each of the portions of the reinforcement resin film portions which overlap the conductive land portions and the corresponding one of the conductive land portions.

It is further advantageous that the surface of each of the conductive land portions is recessed from the surface portion of the wiring substrate at the peripheral portion of the corresponding one of the conductive land portions, thereby a gap is formed between each of the portions of the reinforcement resin film portions which overlap the conductive land portions and the corresponding one of the conductive land portions.

It is preferable that, in the disposing solder balls respectively on the conductive land portions which expose via the opening portions of the reinforcement resin film portions and heating and melting the solder balls, material of each of the melted solder balls enters into the gap, and the portions of the reinforcement resin film portions which overlap the conductive land portions being pushed away from the conductive land portions.

It is also preferable that, in the forming a plurality of reinforcement resin film portions on the second surface of the wiring substrate, the reinforcement resin film portions having substantially uniform thickness are formed.

It is further preferable that the diameter of each of the opening portions of the reinforcement resin film portions is smaller than the diameter of the corresponding one of the solder balls.

It is advantageous that the diameter of each of the opening portions of the reinforcement resin film portions is 50–80% of the diameter of the corresponding one of the solder balls.

It is also advantageous that the width of each of the portions of the reinforcement resin film portions which overlap the conductive land portions is approximately 10% of the diameter of the corresponding one of the solder balls.

It is further advantageous that each of the reinforcement resin film portions has a circle shape and has the opening portion at the center thereof, and the diameter of each of the reinforcement resin film portions is larger than the diameter of the corresponding one of the solder balls and is smaller than twice of the diameter of the corresponding one of the solder balls.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, embodiments of the present invention will now be described in detail.

Figure 1:
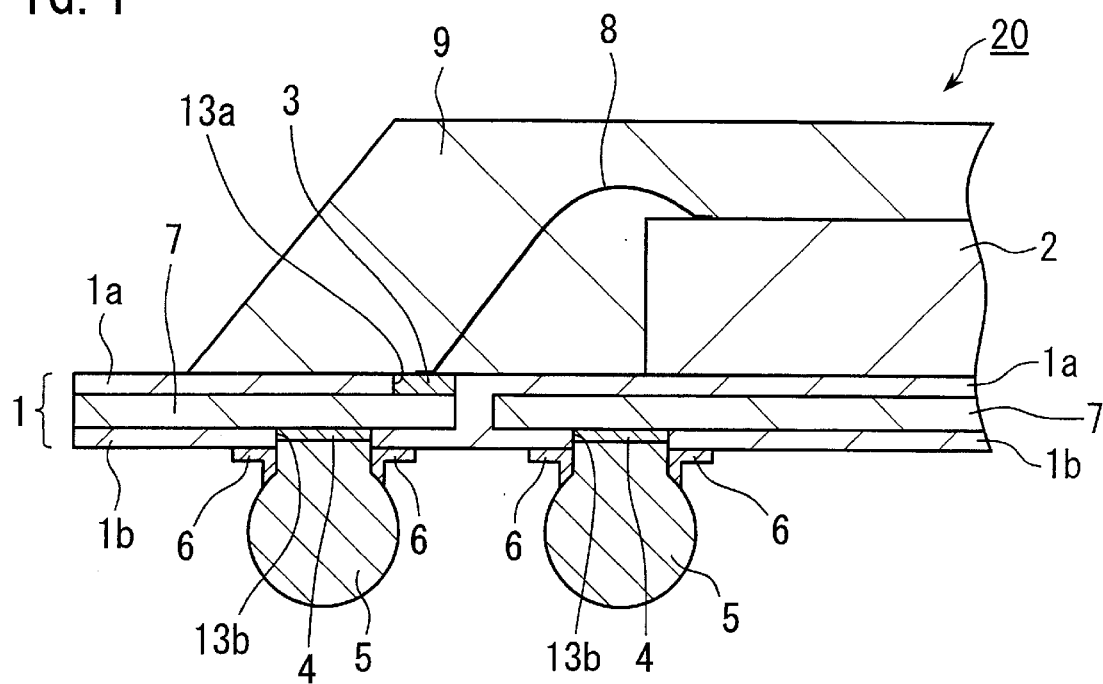
FIG. 1 is a partial enlarged cross sectional view of a semiconductor device according to an embodiment of the present invention.

FIG. 1 is a partial enlarged cross sectional view of a semiconductor device 20 according to an embodiment of the present invention. The semiconductor device 20 of FIG. 1 comprises a tape 1 as a wiring substrate, and a semiconductor element or chip 2 mounted on the tape 1. The tape 1 has a structure in which the inner wiring pattern layer 7 is sandwiched between an insulating layer 1a and an insulating layer 1b. The inner wiring pattern layer 7 is made, for example, of a copper wiring pattern layer. The insulating layers 1a and 1b are made, for example, of polyimide and the like. The tape 1 also functions as a flexible wiring substrate. The semiconductor chip 2 is mounted on the insulating layer 1a which is disposed on the face side surface of the tape 1.

In each of opening portions 13a of the insulating layer 1a on the face side surface of the tape 1, there is formed an electrode or an electrode pattern portion 3. The electrode pattern portion 3 is electrically coupled with an electrode of the semiconductor chip 2 not shown in the drawing, via a bonding wire 8. In each of opening portions 13b of the insulating layer 1b on the backside surface of the tape 1, there is formed an electrode or a conductive land portion 4 for coupling a solder ball thereon. Each of the conductive land portions 4 is electrically coupled with a corresponding electrode pattern portion 3 on the face side of the tape 1 via the inner wiring pattern layer 7.

The semiconductor device 20 also comprises an encapsulation resin portion 9 which is formed on the face surface of the tape 1 and which covers the semiconductor chip 2, the bonding wire 8 and the electrode pattern portion 3. The semiconductor device 20 further comprises the solder balls 5 each coupled with the conductive land portion 4. The solder balls 5 are disposed on the backside of the tape 1 in a grid like arrangement.

Figure 2:
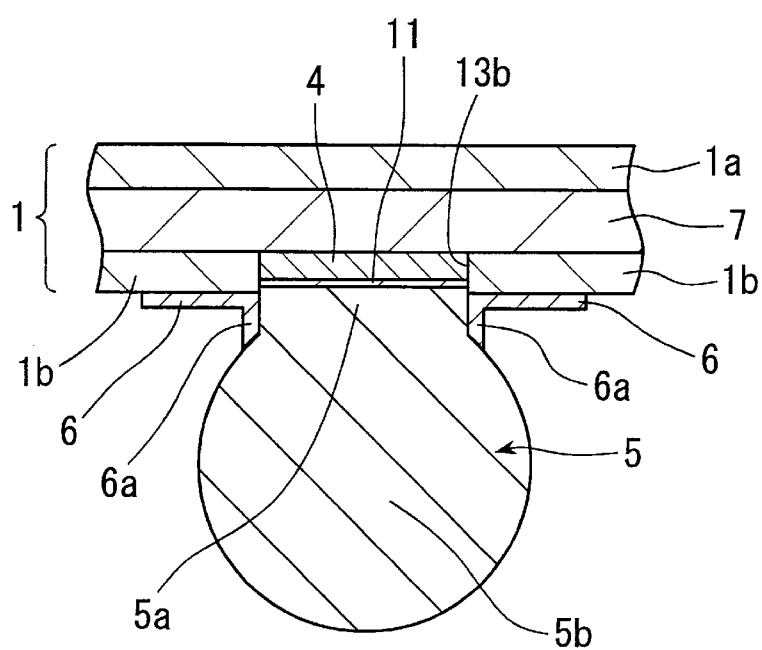
FIG. 2 is a partial enlarged cross sectional view showing a structure near a coupling portion between the conductive land portion and the solder ball of the semiconductor device of FIG. 1.

FIG. 2 is a partial enlarged cross sectional view showing a structure near a coupling portion between the conductive land portion 4 and the solder ball 5 of the semiconductor device 20 of FIG. 1.

As shown in FIG. 2, on the surface of the conductive land portion 4, there is formed a gold plated layer 11 which is not shown in FIG. 1 but which is shown in FIG. 2. The solder ball 5 is coupled with the conductive land portion 4 via the gold plated layer 11. The solder ball 5 comprises a column shaped portion 5a which is joined to the conductive land portion 4, and a spherical or sphere shaped portion 5b which connects to the column shaped portion 6a. The column shaped portion 5a and the sphere shaped portion 5b are formed as a unified body. A reinforcement resin film portion 6 is formed on the peripheral portion of each of the conductive land portions 4. The reinforcement resin film portion 6 is made, for example, of elastic material, for example, silicone resin and the like. The reinforcement resin film portion 6 has a ring or doughnut shape which surrounds the solder ball 5. The inner circumference portion 6b of the reinforcement resin film portion 6 is pushed up and bent by the column shaped portion 6a of the solder ball 5. A bent inner circumference portion 6a of the reinforcement resin film portion 6 surrounds the peripheral portion of the column shaped portion 5a of the solder ball 5, and is pressed on the column shaped portion 5a of the solder ball 5 by elastic or resilient force of the reinforcement resin film portion 6. Therefore, the solder ball 5 is further supported to the wiring substrate 1 by the resilient force of the reinforcement resin film portion 6, and thereby coupling between the solder ball 5 and the conductive land portion 4 is reinforced.

With reference to FIG. 3 through FIG. 8, an explanation will now be made on a method of manufacturing a semiconductor device having the above-mentioned structure.

Figure 3:
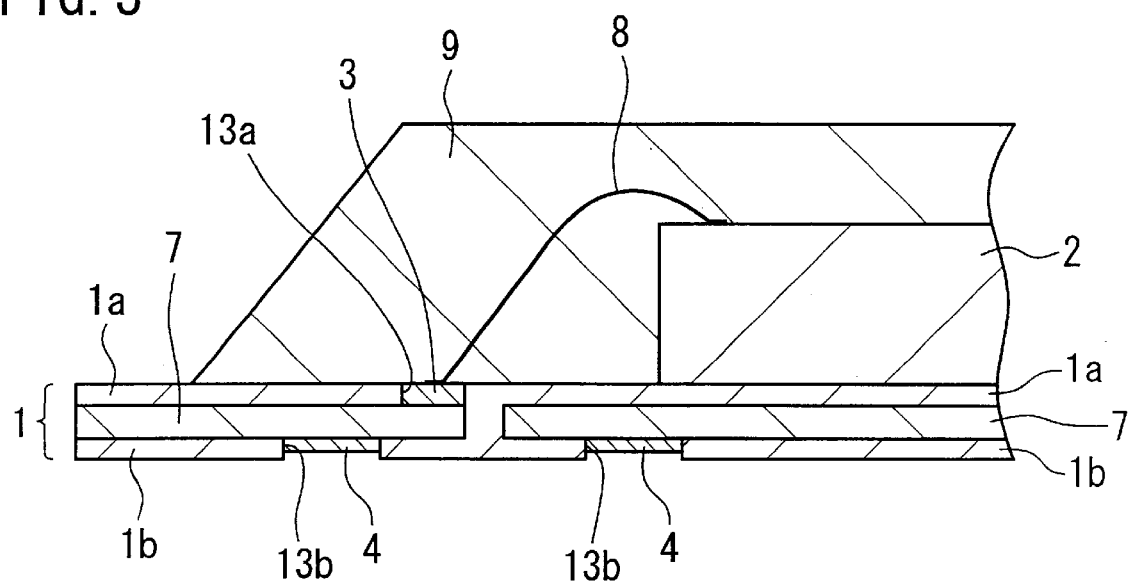
FIG. 3 is a partial enlarged cross sectional view of a semiconductor device of FIG. 1 in the condition before forming the reinforcement resin film.

FIG. 3 is a partial enlarged cross sectional view of a semiconductor device of FIG. 1 in a condition before forming reinforcement resin film portions 6. First, a tape 1 as a flexible wiring substrate is prepared. The tape 1 has the following structure. That is, an inner wiring pattern layer 7 is sandwiched between insulating base material layers or insulating layers 1a and 1b. The inner wiring pattern layer 7 is made, for example, of a copper wiring pattern layer which can be easily and precisely worked into predetermined patterns. The insulating layers 1a and 1b are made, for example, of polyimide and the like. In each of opening portions 13a of the insulating layer 1a on the face side surface of the tape 1, there is formed an electrode or an electrode pattern portion 3. Also, in each of opening portions 13b of the insulating layer 1b on the backside surface of the tape 1, there is formed an electrode or a conductive land portion 4 for joining a solder ball thereto. Each of the conductive land portions 4 is electrically coupled with a corresponding electrode pattern portion 3 on the face side of the tape 1 via the inner wiring pattern layer 7. On the surface of each of the conductive land portions 4, there is formed a gold plated layer 11. The height of the outer surface of the gold plated layer 11 from the lower surface of the inner wiring pattern layer 7 is smaller than that of the insulating layer 1b. That is, the outer surface of the gold plated layer 11 is recessed from the outer surface of the insulating layer 1b. The tape 1 having the structure mentioned above is prepared by using any suitable method.

A semiconductor chip 2 is then mounted on the surface of the tape 1, that is, on the surface of the insulating layer 1a. Then, each of the electrode pattern portions 3 on the surface of the tape 1 is electrically coupled with a corresponding electrode of the semiconductor chip 2 not shown in the drawing via a bonding wire 8. Thereafter, an encapsulation resin portion 9 is formed on the face surface of the tape 1 such that the encapsulation resin portion 9 covers the semiconductor chip 2, the bonding wires 8 and the electrode pattern portions 3. Thereby, the structure shown in FIG. 3 is obtained.

Figure 4:
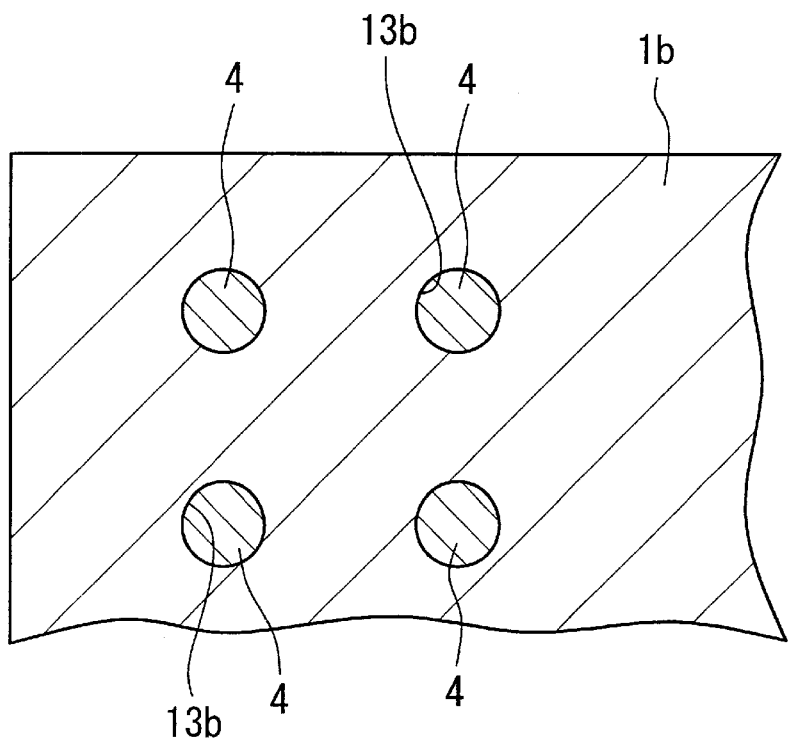
FIG. 4 is a partial plan view showing a structure of the backside of the semiconductor device shown in FIG. 3.

As mentioned above, on the backside surface of the tape 1, there are formed the conductive land portions 4 for coupling solder balls. FIG. 4 is a partial plan view showing a structure of the backside of the semiconductor device shown in FIG. 3. As shown in FIG. 4, the conductive land portions 4 are disposed in a grid like arrangement, and each of the conductive land portions 4 has a round or circle shape.

Next, the reinforcement resin film portions 6 are applied or formed onto predetermined areas of the backside surface of the tape 1. This process of forming the reinforcement resin film portions 6 is performed before disposing the solder balls 5 on the conductive land portions 4. The reinforcement resin film portions 6 are made, for example, of silicone resin and the like.

Figure 5:
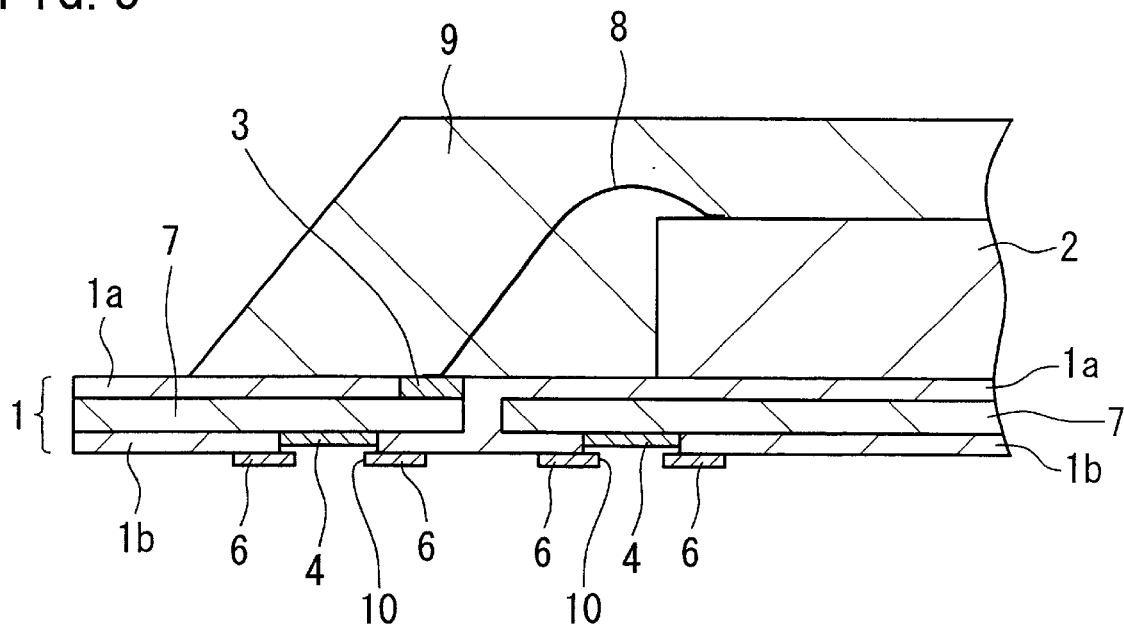
FIG. 5 is a partial enlarged cross sectional view of a semiconductor device showing a condition just after forming the reinforcement resin film.
Figure 6:
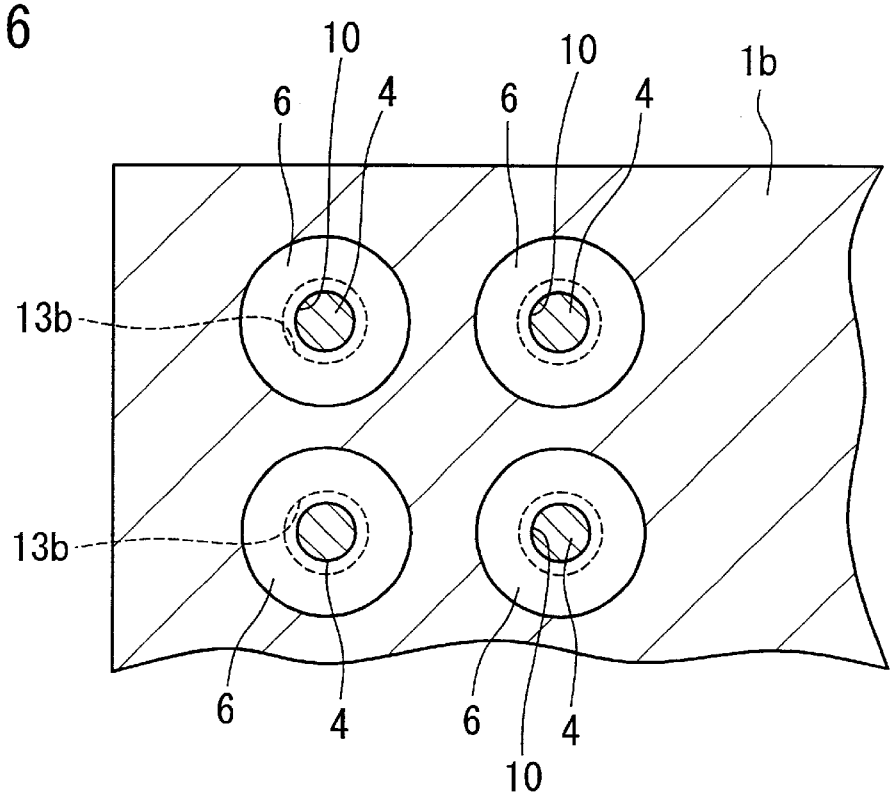
FIG. 6 is a bottom view of the semiconductor device of FIG. 5.

FIG. 5 is a partial enlarged cross sectional view of a semiconductor device showing a condition just after forming the reinforcement resin film portions 6. FIG. 6 is a bottom view of the semiconductor device of FIG. 5. As shown in FIGS. 5 and 6, the reinforcement resin film portion 6 is formed for each of the conductive land portions 4. Each of the reinforcement resin film portions 6 has a round or circle shaped opening 10 at the center thereof That is, each of the reinforcement resin film portions 6 has a ring or doughnut shape. The outer diameter of the reinforcement resin film portion 6 is larger than the diameter of the conductive land portion 4. The diameter of the opening 10 of the reinforcement resin film portion 6 is smaller than the diameter of the conductive land portion 4. The center of the opening 10 of the reinforcement resin film portion 6 substantially corresponds to the center of the conductive land portion 4. Therefore, each of the reinforcement resin film portions 6 partially overlaps the corresponding one of the conductive land portions 4. It is preferable that the portion of each reinforcement resin film portion 6 overlapping the conductive land portion 4 does not directly contact the gold plated layer 11 on the conductive land portion 4 but there is a minute gap between the reinforcement resin film portion 6 and the gold plated layer 11.

The width of the portion of each reinforcement resin film portion 6 which overlaps the conductive land portion 4, that is, the difference between the radius of the conductive land portion 4 and the radius of the opening 10 of each reinforcement resin film portion 6, is preferably approximately a tenth ($\frac{1}{10}$) of the diameter of the solder ball 5. It is preferable that the outer diameter of each reinforcement resin film portion 6 is larger than the diameter of the solder ball 5 and is smaller than twice the diameter of the solder ball 5. The diameter of the opening 10 of each of the reinforcement resin film portions 6 is preferably smaller than the diameter of the solder ball 5, and more preferably the diameter of the opening 10 is approximately 50–80% of the diameter of the solder ball 5.

As a method of applying the reinforcement resin film portions 6 on the backside surface of the tape 1, it is preferable to use a screen printing method. The screen printing method has superior patterning characteristics and high locational precision. That is, by using the screen printing method, it is possible to form desired patterns easily and precisely at predetermined locations.

Thereafter, in order to completely cure the reinforcement resin film portions 6, a heat treatment process is performed. After the heat treatment process, there is formed a gap between the portion of each reinforcement resin film portion 6 which overlaps the corresponding conductive land portion 4 and the gold plated layer 11 on the corresponding conductive land portions 4. The size of the gap between the reinforcement resin film portion 6 and the gold plated layer 11 corresponds to the difference between the height of the surface of the insulating layer 1$b$ of the tape 1 and the height of the surface of the gold plated layer 11, and is, for example, 5–10 $\mu$m. Also, a portion of each reinforcement resin film portion 6 located on the insulating layer 1$b$ is adhered to the insulating layer 1$b$.

Figure 7:
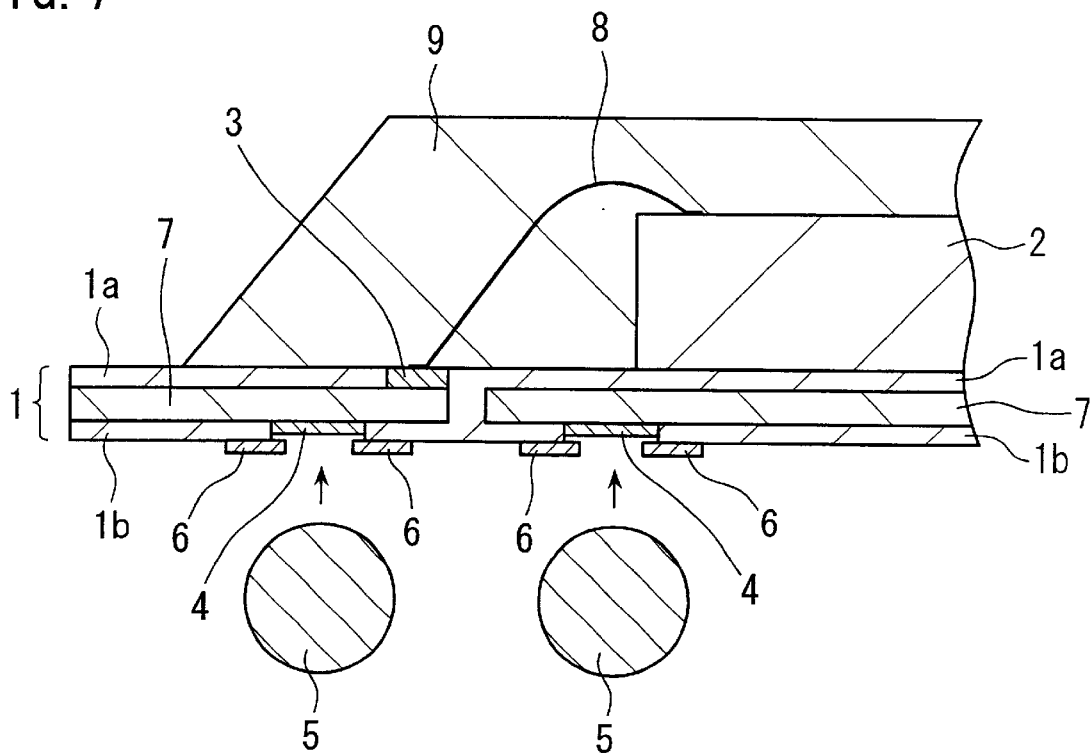
FIG. 7 is a partial enlarged cross sectional view illustrating a process of disposing a sphere shaped solder ball on each of the conductive land portions in the semiconductor device of FIG. 5.
Figure 8:
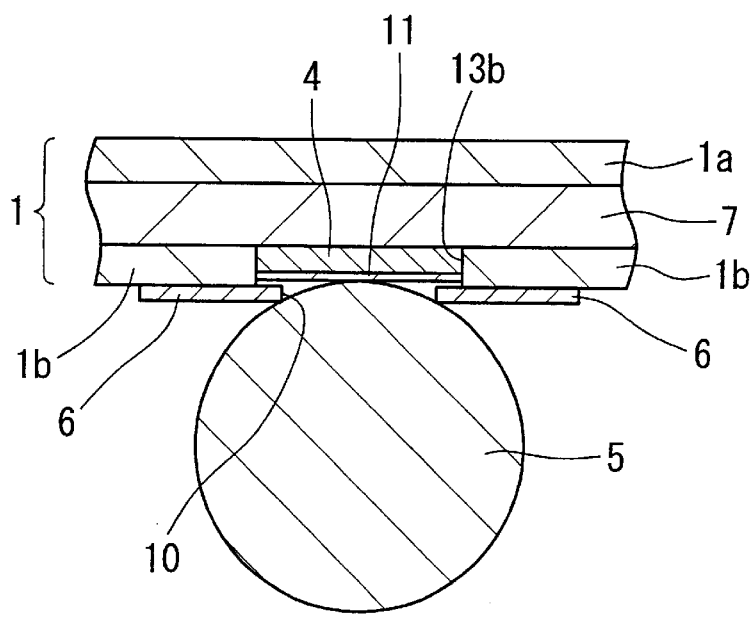
FIG. 8 is a partial enlarged cross sectional view showing a portion near the conductive land portion of the semiconductor device of FIG. 5 in the condition the solder ball is disposed on the conductive land portion.

Next, as shown in FIG. 7, sphere shaped solder balls 5 are disposed on the conductive land portions 4, respectively. FIG. 8 is a partial enlarged cross sectional view showing a portion near the conductive land portion 4 of the semiconductor device of FIG. 5 in the condition the solder ball 5 disposed on the conductive land portion 4. The solder balls 5 are disposed on the conductive land portion 4 by any suitable solder ball mounter. If necessary, the solder balls 5 can be mounted or placed on the conductive land portions 4 in condition the bottom side surface of the semiconductor device of FIG. 5 faces upward.

Then, a heat treatment process is performed to melt the solder balls 5. Material of each of the melted solder balls 5 enters at the gaps between the reinforcement resin film portion 6 and the gold plated layer 11, and spreads and wets the whole surface of the gold plated layer 11. Thereafter, a cooling process is performed to cure the material of the solder balls 5. Thereby, each of the solder balls 5 is joined to the conductive land portion 4 via the gold plated layer 11. Thus, the semiconductor device as shown in FIG. 1 and FIG. 2 is fabricated.

In this embodiment, when the solder ball 5 is melted, the following phenomenon occurs. The solder ball 5 protrudes from the backside surface of the tape 1 in melted condition. The melted solder ball 5 undergoes force which causes the solder ball 5 to become a sphere shape due to the surface tension. Therefore, the portion of each reinforcement resin film portion 6 which overlaps the conductive land portion 4 via a small gap or which overlaps the conductive land portion 4 without adhering thereto is pushed away by the melted solder. Thereby, the portion of each reinforcement resin film porton 6 overlapping the conductive land portion 4 is bent away from the conductive land portion 4 at the location corresponding to the edge portion of the insulating layer 1$b$. Thereafter, the melted solder ball 5 is cured and the reinforcement resin film portion 6 remains bent at the location corresponding to the edge portion of the insulating layer 1$b$.

The inner circumference portion of the bent portion 6$a$ of the reinforcement resin film portion 6 surrounds a column portion 5$a$ of the solder ball 5. The column portion 5$a$ corresponds to a root portion of the solder ball 5. The bent portion 6$a$ of the reinforcement resin film portion 6 shown in FIG. 2 corresponds to the portion of the reinforcement resin film portion 6 which overlaps the conductive land portion 4 shown in FIG. 8. The reinforcement resin film portion 6 is made of material having elasticity or resilience such as silicone resin and the like. Therefore, the inner circumference portion of the bent portion 6$a$ of the reinforcement resin film portion 6 presses the column portion 5$a$ of the solder ball 5 by elastic force or restitutive force. Thereby, coupling between the solder ball 5 and the conductive land portion 4 is reinforced. The other portion of the cured solder ball 5 adjacent to the column portion 5$a$ becomes approximately a sphere due to the action of the surface tension, and forms a sphere shaped portion 5$b$.

When or after the fabricated semiconductor device is mounted on a mother board and the like, shearing stress caused by thermal stress and the like is applied to the interface portions between the land portions of the semiconductor device and the solder balls. There is a possibility that such shearing stress makes the coupling between the land portions of the semiconductor device and the solder balls unstable, causes cracks in the solder balls, and causes separation of the solder balls from the substrate of the semiconductor device. However, in the present embodiment, the coupling of the solder balls 5 with the conductive land portions 4 is reinforced by the reinforcement resin film portions 6. Therefore, even if the shearing stress caused by the thermal stress and the like is applied to the interface portions between the land portions of the semiconductor device and the solder balls, it is possible to absorb or disperse such stress into the material of the reinforcement resin film portions 6. Thus, the coupling between the solder ball 5 and the conductive land portions 4 does not undergo a bad influence thereby. That is, the coupling between the land portions of the semiconductor device and the solder balls does not become unstable, cracks do not occur in the solder balls, and the solder balls do not separate from the substrate of the semiconductor device. Therefore, it is possible to improve reliability of the semiconductor device. Also, a quantity of material for the reinforcement resin film portions 6 can be relatively small, and does not affect the costs of the semiconductor device. Further, when the semiconductor device is mounted on a mother board and the like, the reinforcement resin film portions 6 do not become a hindrance to the mounting of the semiconductor device.

In the above-mentioned embodiment, the reinforcement resin film portions 6 is applied to the backside surface of the tape 1 before joining the solder balls 5 to the conductive land portions 4. Therefore, material of the reinforcement resin film portions 6 does not adhere to the solder balls 5, and it is possible to form the reinforcement resin film portions 6 easily. Thus, it is not necessary to form a mask layer on the solder balls 5 and thereafter to remove the mask layer from the solder balls 5. As a result thereof, it is possible to reduce the number of process steps and manufacturing costs of semiconductor devices.

In the above-mentioned embodiment, each of the conductive land portions 4 to which the solder ball 5 is coupled has a circle or round shape. The diameter of the conductive land portion 4 is, for example, approximately 80% of the diameter of the solder ball 5. The conductive land portions 4 can be formed by using any convenient method. As an example, the conductive land portions 4 can be formed as follows. First, opening portions 13b are formed in the insulating layer 1b covering the inner wiring pattern layer 7 to expose portions of the inner wiring pattern layer 7. On the exposed portions of the inner wiring pattern layer 7, electrode layer portions are formed which become the conductive land portions 4 and which are made of copper and the like. Alternatively, it is possible to use the exposed portions of the inner wiring pattern layer 7 themselves as the conductive land portions 4, without forming the electrode portions on the exposed portions of the inner wiring pattern layer 7.

Additionally, in the above-mentioned embodiment, as shown in FIG. 2, the gold plated layer 11 is formed on the surface of each of the conductive land portions 4. The gold plated layer 11 has a thickness of, for example, 1 μm. The gold plated layer 11 functions to prevent the surface of each the conductive land portions 4 from being oxidized. Also, since the gold plated layer 11 has good wettability with solder material, it becomes possible to realize good coupling between the gold plated layer 11 and the solder ball 5. Therefore, as in the above-mentioned embodiment, it is preferable that the gold plated layer 11 is formed on the conductive land portion 4, and the solder ball 5 and the conductive land portion 4 are coupled with each other via the gold plated layer 11. However, of course, it is possible to directly join the solder ball 5 with the surface of the conductive land portion 4, without forming the gold plated layer 11 on the conductive land portion 4.

The difference between the thickness, i.e., the height, of the insulating layer 1b from the backside surface of the inner wiring pattern layer 7 and the thickness, i.e., the height, of the conductive land portion 4 including the gold plated layer 11 is, for example, approximately 5–10 μm. Thereby, a gap or space into which material of the solder ball 5 can enter can be surely obtained between the reinforcement resin film portion 6 and the conductive land portion 4 including the gold plated layer 11. Also, preferably, the thickness of the reinforcement resin film portion 6 is approximately 10–30 μm.

The end portion of the column like portion 5a of each of the solder balls 5 is joined to the whole surface of the corresponding conductive land portion 4, that is, to the whole surface of the corresponding gold plated layer 11, thereby the solder balls 5 are fixed to the backside surface of the wiring substrate. In this case, each of the column like portions 5a corresponding to the root portions of the solder balls 5 is surrounded by the reinforcement resin film portion 6 which is made of material having elasticity such as silicone resin and the like and which is formed on the insulating layer 1b of the tape 1. Thereby, the coupling of the solder balls 5 with the tape 1 is reinforced.

Among semiconductor devices of the BGA type package, the present invention is especially advantageous in semiconductor devices of the Fine Pitch Ball Grid Array (FPBGA) type package. In the FPBGA type package, the pitch of the solder balls or the distance between the solder balls disposed on the backside surface of the substrate of the semiconductor device is small, and also the diameter of each solder ball is small. When or after such semiconductor device of the FPBGA type package is mounted on a mother board and the like, shearing stress caused by thermal stress and the like is applied to the interface portions between the land portions of the semiconductor device and the solder balls. There is a possibility that such shearing stress causes bad influence on the coupling between the land portions of the semiconductor device and the solder balls.

However, in the present embodiment, the solder balls are also supported by the reinforcement resin film portions, and the coupling of the solder balls with the conductive land portions is reinforced by the reinforcement resin film portions. Thereby, it becomes possible to absorb or disperse the shearing stress into the material of the reinforcement resin film portions. Therefore, it is possible to avoid bad influence caused by such shearing stress on the coupling between the land portions of the semiconductor device and the solder balls. For example, after mounting the semiconductor device on the mother board, it is possible to prevent the solder balls from separating from the tape type substrate of the semiconductor device. Therefore, it is possible to improve reliability of the semiconductor devices.

Also, as another prior art technology, in order to prevent the solder balls from separating from the tape type substrate, the following method was used. That is, when a semiconductor device is mounted on a mother board, under-filling resin is formed which fills the space between the solder balls, so that the shearing stress can be mitigated. According to the present invention, it is possible to mitigate the shearing stress without forming such under-filling resin.

Further in the prior art technology disclosed in Japanese patent laid-open publication No. 10-98045 mentioned before, after bonding the solder balls onto the tape type substrate, resin material for reinforcement is supplied to root portions of the solder balls coupled with the tape type substrate. In this case, the following disadvantages occur. That is, it is necessary to use the resin material having very low viscosity which is less safe in handling. Also, it is necessary to develop an application machine for the resin material which has very minute nozzles and which can apply the resin material with high precision of application location and high precision of application quantity. Further, this technology requires a process of forming a mask layer on the solder balls to avoid adhesion of reinforcement resin material thereto, and a process of removing the mask layer after applying the reinforcement resin material. Therefore, the number of manufacturing process steps of the semiconductor devices becomes large, and manufacturing costs are increased.

On the other hand, in the method of manufacturing a semiconductor device according to the present invention, it is possible to form the reinforcement resin film before bonding the solder balls onto the tape type substrate. Therefore, it is possible to use relatively safe resin material as the material for forming the reinforcement resin film portions. Therefore, it is possible to form the reinforcement resin film portions easily by using an existing screen printing machine. Also, since the material of the reinforcement resin film portions does not adhere to the solder balls, it is not necessary to form a mask layer on the solder balls. Therefore, it is possible to decrease the number of manufacturing process steps of the semiconductor device, and to reduce manufacturing costs thereof.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor device comprising:
   a wiring substrate;
   a semiconductor element mounted on a first surface of the wiring substrate;
   a plurality of conductive land portions exposed respectively via openings of an insulating material portion of a second surface of the wiring substrate which is opposite to the first surface;
   a plurality of solder balls respectively joined to the plurality of conductive land portions; and
   a plurality of reinforcement resin film portions for reinforcing coupling between the solder balls and the conductive land portions, each of the reinforcement resin film portions being formed around a portion of the solder ball joining to the conductive land portion, and each of the reinforcement resin film portions being bent to form a portion along the wiring substrate and a portion along the side surface of the solder ball.

2. A semiconductor device as set forth in claim 1, wherein coupling between the solder balls and the conductive land portions is reinforced by elastic force of the bent portions of the reinforcement resin film portions.

3. A semiconductor device as set forth in claim 1, wherein the plurality of conductive land portions are electrically coupled with electrodes of the semiconductor element.

4. A semiconductor device as set forth in claim 1, wherein each of the reinforcement resin film portions has a structure in which an inner circumferential portion of a ring shaped film having a uniform thickness is pushed and bent away from the conductive land portion.

5. A semiconductor device as set forth in claim 1, wherein the surface of the conductive land portion is recessed from a surface portion of the second surface of the wiring substrate at the peripheral portion of the conductive land portion.

6. A semiconductor device as set forth in claim 1, wherein the reinforcement resin film portions are made of silicone resin.

7. A semiconductor device as set forth in claim 1, wherein the wiring substrate is a flexible wiring substrate in which a conductive wiring pattern layer is sandwiched by insulating layers.

* * * * *